United States Patent
Fukazawa et al.

[11] Patent Number: 5,868,855
[45] Date of Patent: Feb. 9, 1999

[54] SURFACE PROCESSING METHOD AND SURFACE PROCESSING DEVICE FOR SILICON SUBSTRATES

[75] Inventors: Yuji Fukazawa; Kunihiro Miyazaki, both of Yokohama, Japan

[73] Assignee: Kabushki Kaisha Toshiba, Kawasaki, Japan

[21] Appl. No.: 612,413

[22] Filed: Mar. 7, 1996

[30] Foreign Application Priority Data

Mar. 10, 1995 [JP] Japan .................................... 7-050976

[51] Int. Cl.$^6$ ............................. H01L 21/302; B08B 6/00
[52] U.S. Cl. ................................ 134/1.3; 216/90; 216/97; 216/99
[58] Field of Search ............................ 216/99; 134/1.3; 216/90, 97

[56] References Cited

U.S. PATENT DOCUMENTS

| | | | |
|---|---|---|---|
| 4,171,242 | 10/1979 | Liu | 156/657 |
| 5,261,966 | 11/1993 | Mashimo et al. | 134/2 |
| 5,511,569 | 4/1996 | Mukogawa | 134/112 |

FOREIGN PATENT DOCUMENTS

| | | |
|---|---|---|
| 0 497 247 A1 | 8/1992 | European Pat. Off. . |
| 44 12 896 A1 | 1/1995 | Germany . |
| 3218015 | 9/1991 | Japan . |
| 4-103124 | 4/1992 | Japan . |
| 4-113620 | 4/1992 | Japan . |
| 4103124 | 4/1992 | Japan . |
| 4113620 | 4/1992 | Japan . |
| 4-144131 | 5/1992 | Japan . |
| 4144131 | 5/1992 | Japan . |
| 5243195 | 9/1993 | Japan . |
| 8-045886 | 2/1996 | Japan . |

OTHER PUBLICATIONS

IBM Technical Disclosure Bulletin, "Spin–Clean Ultrasonic Jet Cleaner," vol. 34, No. 1, Jun. 1991.

T. Ohmi, T. Isagawa, T. Imaoka, and I. Sugiyama, "Ozone Decomposition in Ultrapure Water and Continuous Ozone Sterilization for a Semiconductor Ultrapure Water System," Journal of the Electrochemical Society vol. 139, No. 11, Nov. 1992.

M. Miyashita et al., "Dependence of Thin Oxide Films Quality on Surface Micro–Roughness," Department of Electronics, Tohoku University, pp. 45–46, Sendal 990, Japan.

*Primary Examiner*—Benjamin Utech
*Assistant Examiner*—George Goudreau
*Attorney, Agent, or Firm*—Finnegan, Henderson, Farabow, Garrett & Dunner, L.L.P.

[57] ABSTRACT

A silicon wafer is set in a processing bath and an HF water solution and ozone water are respectively supplied from an HF line and ozone water line into the processing bath via an HF valve and ozone water valve to create a mixture. The mixture contains an HF water solution with a concentration of 0.01% to 1% and ozone water with a concentration of 0.1 ppm to 20 ppm, has substantially the same etching rate for silicon and for silicon oxide film and is used at a temperature in the range of 10° to 30° C. The silicon wafer and the silicon oxide film formed on part of the surface of the wafer can be simultaneously cleaned by use of the above mixture.

10 Claims, 3 Drawing Sheets

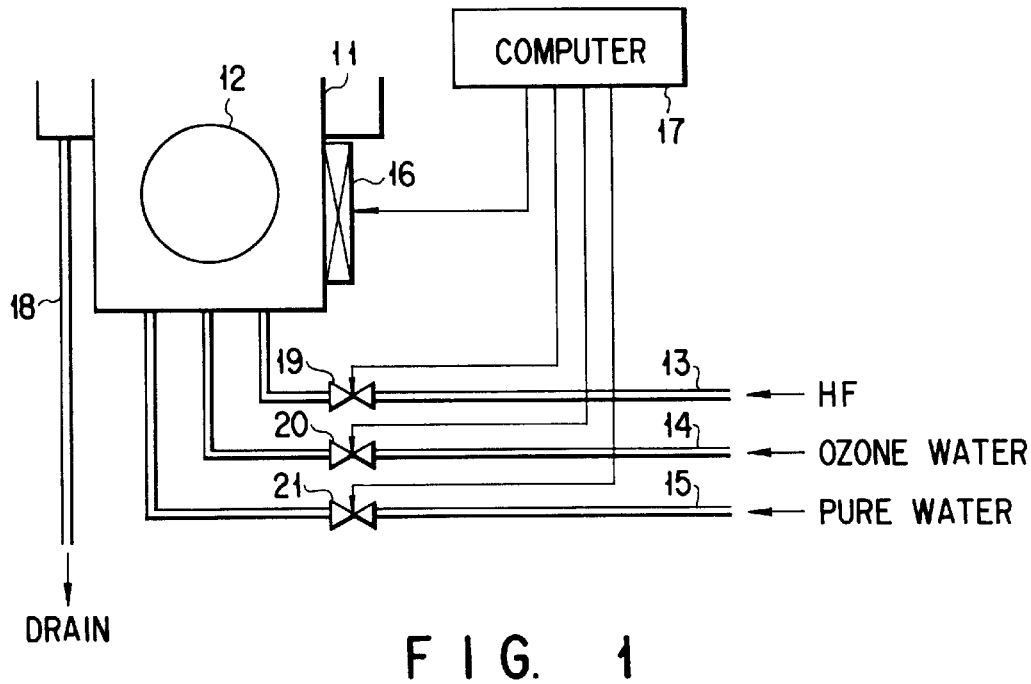
F I G. 1
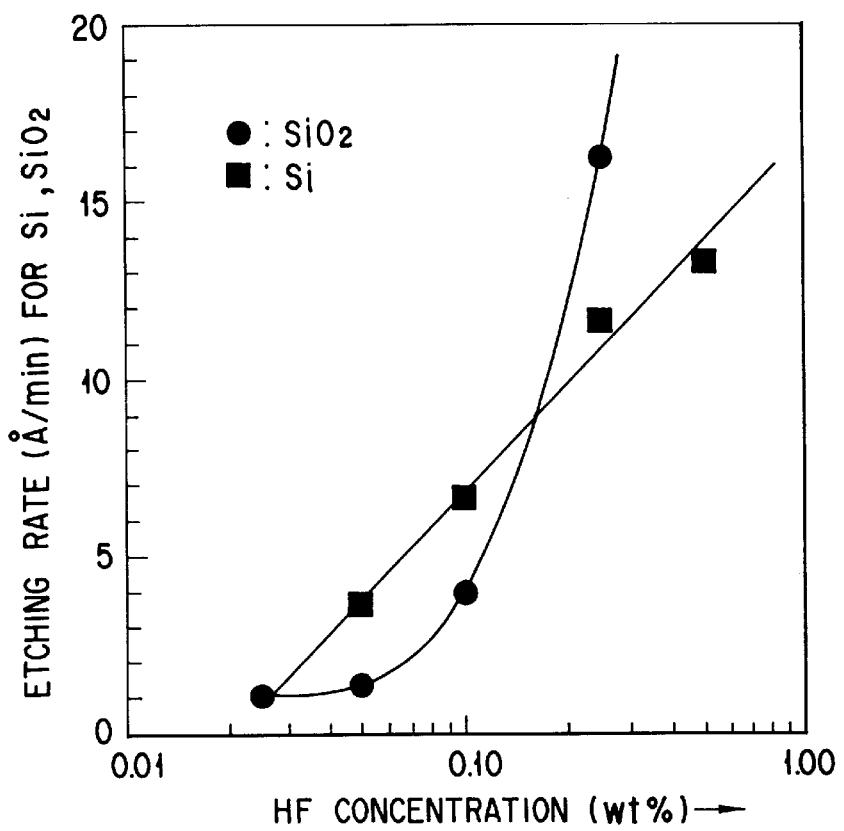
F I G. 3

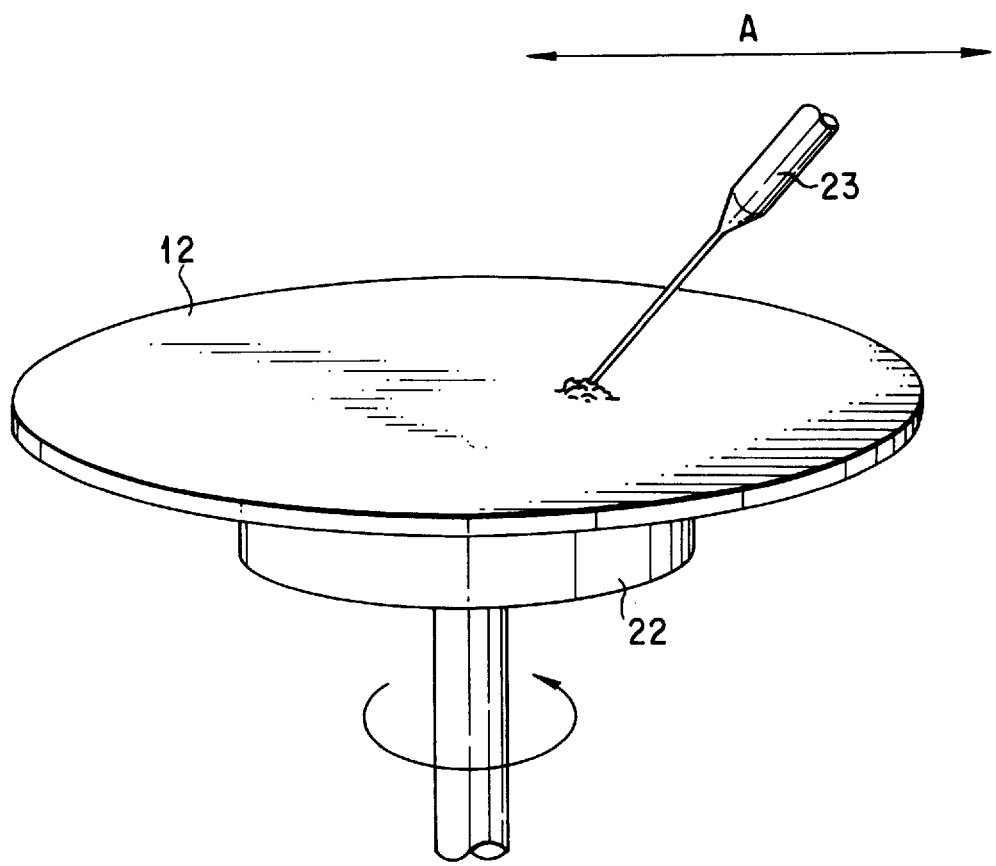
F I G. 4

SURFACE PROCESSING METHOD AND SURFACE PROCESSING DEVICE FOR SILICON SUBSTRATES

BACKGROUND OF THE INVENTION

1. Field of the Invention

This invention relates to an etchant used in a manufacturing process for semiconductor devices such as ICs and LSIs, and a surface processing method and surface processing device for silicon substrates using the above etchant, and is particularly suitable for cleaning of a silicon wafer (silicon substrate) having a silicon oxide film formed on part of the surface thereof.

2. Description of the Related Art

Generally, for cleaning silicon wafers, a cleaning solution called an SC-1 solution containing $NH_4OH$, $H_2O_2$ and $H_2O$ with the volume ratio of $NH_4OH:H_2O_2:H_2O$ of 1:1:5 and kept at a temperature of approx. 70° C. is used.

The SC-1 solution contains ammonia which is alkaline and has a property of etching silicon. The lift-off effect obtained by etching silicon is considered as a sort of mechanism for removing particles attached to the surface of the silicon wafer. However, the SC-1 solution used in the conventional cleaning technique, the cleaning method and cleaning device using the SC-1 solution have the following problems.

(1) The surface roughness caused by etching the surface of the silicon wafer degrades the reliability of the gate oxide film. This is described in, for example, Symposium on VLSI Technology, Ohiso pp. 45–46, May 1991 M. Miyashita, M. Itano, T. Imaoka, I. Kawabe and T. Ohmi "Dependence of thin oxide films quality on surface micro-roughness".

(2) If Fe, Al, Zn or the like is contained in the SC-1 solution, the metal impurity is attached to the surface of the silicon wafer to contaminate the silicon wafer against its purpose.

(3) The etching rate by use of the SC-1 solution for silicon is different from and higher than that for silicon oxide film (Si=approx. 20 Å/min, $SiO_2$=approx. 1 Å/min). Therefore, the rate of removal of particles by the lift-off effect is different on the surface of the silicon wafer and on the surface of the silicon oxide film. For this reason, when the cleaning process is effected with the silicon oxide film formed on the silicon wafer, it becomes necessary to clean the silicon wafer surface and the silicon oxide film surface in different steps by use of different cleaning solutions.

(4) Since the process is effected at temperatures of 70° C. to 80° C., ammonia and the like are evaporated to make a contamination source in the clean room.

As described above, with the conventional etchant, and the surface processing method and surface processing device for silicon substrates using the above etchant, the surface of the processed silicon substrate becomes rough and the processing solution causes contamination by metal impurity contained therein against its purpose. Further, since the particle removing rate (etching rate) is different for the surface of the silicon substrate and for the surface of the silicon oxide film, it becomes necessary to effect different cleaning steps when the surface of the silicon substrate having a silicon oxide film formed thereon is processed, thereby increasing the number of steps. In addition, the high-temperature process is required and a problem that the cleaning solution makes a contamination source in the clean room may occur.

SUMMARY OF THE INVENTION

Accordingly, a first object of this invention is to provide an etchant capable of making the surface of a processed silicon substrate flat, effecting the particle removing process at the same rate for the silicon substrate surface and for the silicon oxide film surface without causing contamination by metal impurity contained therein against its purpose, and permitting the process to be effected at the room temperature.

A second object of this invention is to provide a silicon substrate surface processing method capable of making the surface of a processed silicon substrate flat, effecting the particle removing process at the same rate for the silicon substrate surface and for the silicon oxide film surface without causing contamination by metal impurity contained in a processing solution against its purpose, and permitting the process to be effected at the room temperature.

A third object of this invention is to provide a silicon substrate surface processing device capable of making the surface of a processed silicon substrate flat, effecting the particle removing process at the same rate for the silicon substrate surface and for the silicon oxide film surface without causing contamination by metal impurity contained in a processing solution against its purpose, and permitting the process to be effected at the room temperature.

The first object can be attained by an etchant comprising an HF water solution with a concentration of 0.01% to 1%, and ozone water with a concentration of 0.1 ppm to 20 ppm, wherein the etching rate for silicon and the etching rate for silicon oxide film are substantially the same and the temperature thereof is kept in the range of 10° to 30° C.

If the above etchant is used to process the surface of the silicon substrate, the surface of the silicon substrate after the processing can be made flat in comparison with a case wherein an SC-1 solution is used and a lowering in the reliability of a gate oxide film formed in the later step can be suppressed to enhance the reliability of the silicon element. The etchant can prevent contamination by metal impurity and remove heavy metal such as Cu and the like which cannot be removed only by use of the HF water solution. Further, since the process can be effected at room temperatures, a problem that the etchant makes a contamination source of the clean room does not occur, and since the ozone water after the cleaning process can be easily decomposed by UV application or the like, waste disposal can be easily effected and environment pollution can be suppressed. Further, since the etching rate for silicon and the etching rate for the silicon oxide film are substantially equal to each other, the silicon substrate surface and the surface of a silicon oxide film formed on the surface of the silicon substrate can be simultaneously cleaned.

The second object can be attained by a silicon substrate surface processing method comprising the steps of setting a silicon substrate having a silicon oxide film formed on part of the surface thereof into a processing bath; supplying an HF water solution and ozone water into the processing bath to create a mixture containing HF with a concentration of 0.01% to 1% and ozone water with a concentration of 0.1 ppm to 20 ppm and kept at a temperature of 10° to 30° C.; and simultaneously etching the silicon substrate and silicon oxide film at substantially the same etching rate with the mixture contained in the processing bath.

According to the above surface processing method, the surface of the silicon substrate after the processing can be made flat in comparison with a case wherein a processing method using an SC-1 solution is used and a lowering in the reliability of a gate oxide film formed in the later step can be suppressed to enhance the reliability of the silicon element. Further, in the above processing method, contamination by metal impurity can be prevented and heavy metal such as Cu and the like which cannot be removed only by use of the HF water solution can be removed, thereby attaining a significant cleaning effect. Further, since the process can be effected at room temperatures, there occurs no possibility that the clean room is contaminated, and since the ozone water after the cleaning process can be easily decomposed by UV application or the like, waste disposal can be easily effected and environment pollution can be suppressed. Further, since the etching rate for silicon and the etching rate for the silicon oxide film are substantially equal to each other and the silicon substrate surface and the surface of a silicon oxide film formed on the surface of the silicon substrate can be simultaneously cleaned, steps of processing the silicon substrate surface and the surface of the silicon oxide film and a cleaning step using pure water effected between the above steps which are required in the conventional case can be omitted and the cleaning process can be effected in a single step in this invention and the processing step can be made simple and short.

The third object can be attained by a silicon substrate surface processing device comprising a processing bath for accommodating a silicon substrate; HF supplying means for supplying an HF water solution with a concentration of 0.01% to 1% into the processing bath; ozone water supplying means for supplying ozone water with a concentration of 0.1 ppm to 20 ppm into the processing bath; pure water supplying means for supplying pure water into the processing bath; and control means for controlling the HF supplying means, ozone water supplying means and pure water supplying means to effect the surface processing, controlling the HF supplying means and ozone water supplying means to create a mixture containing an HF water solution and ozone water in the processing bath and process the surface of the silicon substrate, then controlling the ozone water supplying means to replace the mixture in the processing bath by ozone water, and controlling the pure water supplying means to replace the ozone water in the processing bath by pure water.

According to the above surface processing device, the surface of the silicon substrate after the processing can be made flat in comparison with a case wherein a processing device using an SC-1 solution is used and a lowering in the reliability of a gate oxide film formed in the later step can be suppressed to enhance the reliability of the silicon element. Further, by using the above processing device, contamination by metal impurity can be prevented and heavy metal such as Cu and the like which cannot be removed only by use of the HF water solution can be removed, thereby attaining a significant cleaning effect. Further, since the process can be effected at room temperatures, there occurs no possibility that the clean room is contaminated, and since the ozone water after the cleaning process can be easily decomposed by UV application or the like, waste disposal can be easily effected and environment pollution can be suppressed. Further, since the etching rate for silicon and the etching rate for the silicon oxide film are controlled by the control means so as to be substantially equal to each other, the silicon substrate surface and the surface of a silicon oxide film formed on the surface of the silicon substrate can be simultaneously cleaned, and steps of processing the silicon substrate surface and the surface of the silicon oxide film and a cleaning step using pure water effected between the above steps which are required in the conventional case can be omitted and the cleaning process can be effected in a single step in this invention and the processing step can be made simple and short, and the control process can be simplified.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a schematic construction diagram of a silicon substrate surface processing device to which this invention is applied, for illustrating an etchant according to one embodiment of this invention, and a silicon substrate surface processing method and surface processing device using the etchant;

FIG. 3 is a diagram for illustrating the relation between the HF concentration in a mixture of HF water solution and ozone water and the etching rates for silicon and silicon oxide film; and FIG. 4 is a schematic view of a cleaning apparatus for performing the above-described sheet-fed type cleaning, useful in explaining a method for treating the surface of a silicon substrate according to another embodiment of the invention.

DETAILED DESCRIPTION OF THE PREFERRED EMBODIMENTS

Figure 2:
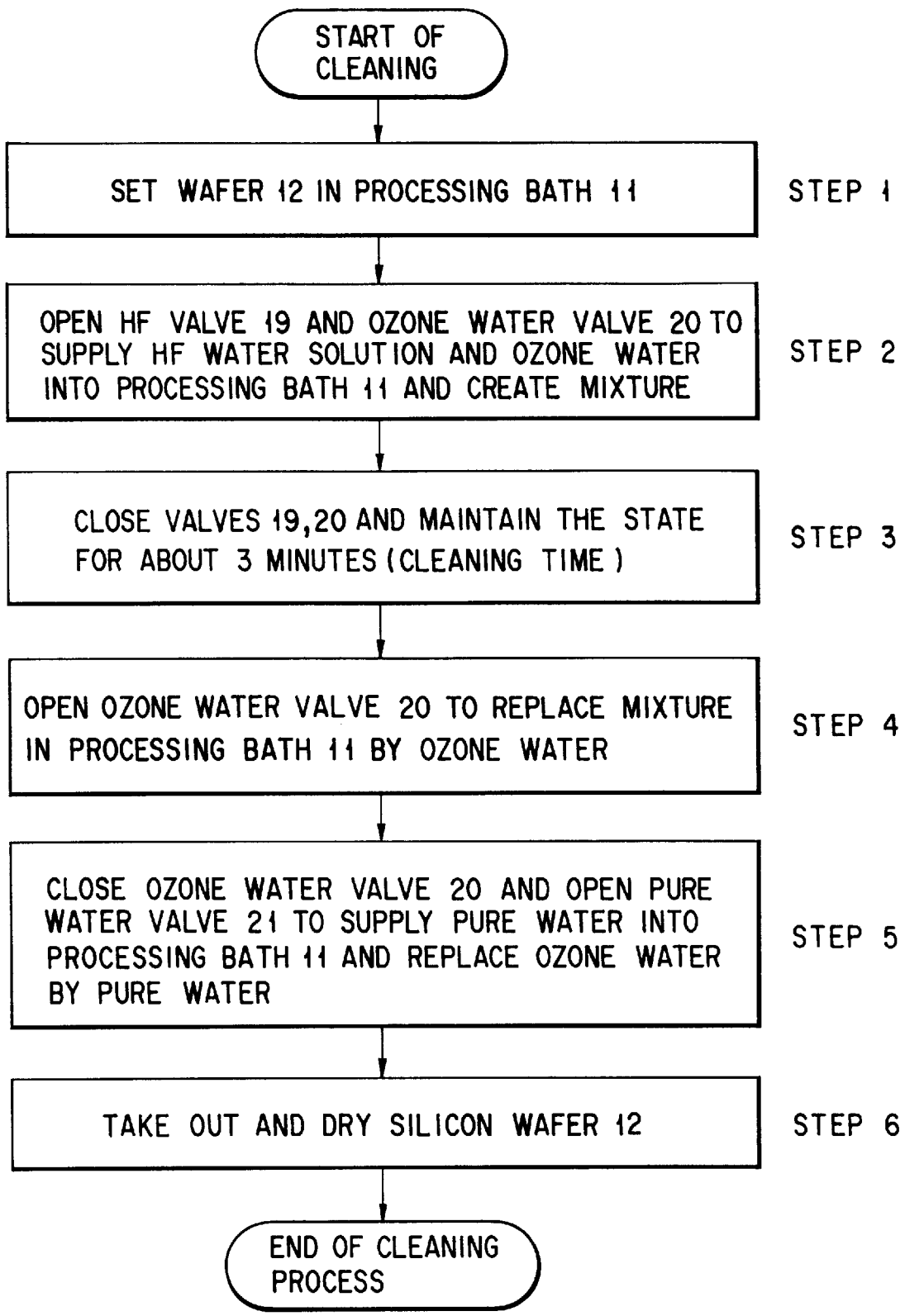
FIG. 2 is a flowchart for illustrating the silicon substrate surface processing method using the surface processing device shown in FIG. 1.

FIG. 1 is a schematic construction diagram of a silicon substrate surface processing device to which this invention is applied, for illustrating an etchant, and a silicon substrate surface processing method and surface processing device using the etchant.

To a processing bath 11 having a silicon wafer 12 set therein, an HF supply line 13 for supplying an HF water solution into the processing bath 11, an ozone water supply line 14 for supplying ozone water, and a pure water supply line 15 for supplying pure water are connected. An HF valve 19, ozone water valve 20 and pure water valve 21 are respectively inserted in the supply lines 13, 14 and 15. The open/closed position of each of the valves 19, 20, 21 is controlled by a computer 17 so that necessary amounts of respective liquids can be selectively supplied into the processing bath 11. The respective liquids overflowing the processing bath 11 are drained via a drainage line 18.

Further, in the processing bath 11, an ultrasonic diaphragm 16 for subjecting the liquids to ultrasonic vibration is provided, and the computer 17 controls the ultrasonic wave radiation timing as well as the supply of respective liquids.

The ozone water is created by dissolving ozone gas in pure water via a membrane film.

Next, the silicon substrate surface processing method by the above surface processing device is explained with reference to the flowchart shown in FIG. 2 by taking the process of cleaning a silicon substrate (silicon wafer 12) having a silicon oxide film formed on part of the surface thereof as an example.

After the silicon wafer 12 is set in the processing bath 11 (STEP 1), the valve 19 of the HF supply line 13 and the valve 20 of the ozone water supply line 20 are opened by the control of the computer 17. As a result, the HF water solution and ozone water are supplied into the processing bath 11 to make a mixture. At this time, for example, the ozone water with a concentration of 2 ppm is supplied into the processing bath 11 at a flow rate of approx. 20 litter/ minute and the HF water solution with a concentration of approx. 40% is supplied into the processing bath at a flow rate of 100 cc/minute (STEP 2).

When the processing bath 11 is filled with the mixture of HF water solution and ozone water, the valves 19, 20 are closed and the state is maintained for three minutes (cleaning time) (STEP 3). The temperature of the mixture is kept at a room temperature, that is a temperature, of 23° and 25° C.

After this, the ozone water valve 20 is opened and the mixture of HF water solution and ozone water in the processing bath 11 is replaced by ozone water. Ozone water is continuously supplied to overflow for approx. 10 minutes so as to fill the processing bath 11 with ozone water (STEP 4).

Next, the ozone water valve 20 is closed and the pure water valve 21 is opened to supply pure water into the processing bath 11 so as to replace the ozone water by the pure water (STEP 5).

Then, the silicon wafer 12 is taken out and dried (STEP 6), and thus the cleaning process is completed.

FIG. 3 shows the etching rates for a silicon film and silicon oxide film (thermal oxidation film) in an etchant according to this invention. When the concentration of the ozone water before mixing is approx. 2 ppm, the etching rates for the silicon film and thermal oxidation film can be adjusted according to the HF concentration. Therefore, unlike the case of SC-1 solution, the etching amounts of the silicon film and thermal oxidation film can be made substantially equal to each other by setting the HF concentration to 0.2%, for example. Further, the surface roughness of the silicon film at this time is approx. 0.081 nm and is approximately equal to the surface roughness of 0.091 nm which is obtained by the process using an HF water solution, and the extremely flat surface in comparison with the surface roughness of 0.3 nm which is obtained by the cleaning process using an SC-1 solution can be obtained. Further, the mixture of HF water solution and ozone water can not only prevent attachment of metal impurity contained in the mixture, but also remove heavy metal such as Cu which cannot be removed only by use of HF water solution. Since the process can be effected at the room temperature and the ozone water after the cleaning process can be easily decomposed by UV application or the like, waste disposal can be easily effected and environment pollution can be suppressed. The particle removing effect can be enhanced by applying ultrasonic waves to the ozone water or pure water in the processing bath 11 by driving the ultrasonic diaphragm 16 under the control of the computer 17 while the ozone water or pure water is overflowing in the process of STEP 4 or STEP 5.

In the above explanation, a case wherein the mixture of HF water solution and ozone water is used is explained as an example, but buffered hydrofluoric acid, for example, a water solution containing hydrofluoric acid and ammonium acid fluoride may be used instead of the HF water solution. In this case, ammonium acid fluoride is contained in the mixture, but the same effect can be attained even if a small amount of foreign matter is contained. Further, the batch type cleaning process is explained, but the same effect can be attained when this invention is applied to the sheet-fed type cleaning process.

According to the experiments by the inventor of this application and others, a sufficiently high cleaning effect can be attained if the HF concentration of the mixture is in the range of 0.01% to 1% and the concentration of the ozone water is in the range of 0.1 ppm to 20 ppm. Further, the above liquids can be used in steps other than the cleaning step by adjusting the concentration thereof. Further, since the ozone concentration becomes higher when the temperature of the mixture is low and ozone is decomposed when the temperature thereof becomes high, it is preferable to set the temperature in the range of 10° to 30° C.

FIG. 4 is a schematic view of a cleaning apparatus for performing the above-described sheet-fed type cleaning, useful in explaining a method for treating the surface of a silicon substrate according to another embodiment of the invention. The silicon substrate (silicon wafer) 12 is placed on a rotary table 22. A nozzle 23 is provided above the rotary table 22. Before cleaning, HF water solution is mixed with ozone water to create a cleaning mixture with an HF concentration of 0.01% to 1%, an ozone water concentration of 0.1 ppm to 20 ppm, and a temperature of 10° to 30° C. Thereafter, while the rotary table is rotated, the mixture is applied from the nozzle 23 to the to-be-cleaned surface of the silicon substrate 12 (on which a silicon oxide film is partially formed). At this time, the nozzle 23 is moved in the radial direction of the silicon substrate 12, as is indicated by arrow A. as a result, the silicon substrate 12 and the silicon oxide film formed thereon are etched at substantially the same etching rate, thereby performing etching.

As described above, according to this invention, an etchant and a silicon substrate surface processing method and surface processing device which can make the surface of a processed silicon substrate flat, effect the particle removing process at the same rate for the silicon substrate surface and for the silicon oxide film surface without causing contamination by metal impurity contained therein against its purpose, and permitting the process to be effected at the room temperature can be obtained.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A silicon substrate surface processing method comprising the steps of:

setting a silicon substrate having a silicon oxide film formed on part of the surface thereof into a processing bath;

supplying an HF water solution and ozone water into the processing bath to create a mixture containing HF with a concentration of 0.01% to 1% and ozone water with a concentration of 0.1 ppm to 20 ppm and kept at a temperature of 10° to 30° C.; and simultaneously etching the silicon substrate and silicon oxide film at substantially the same etching rate with the mixture contained in the processing bath.

2. A surface processing method according to claim 1, wherein said step of simultaneously etching the silicon substrate and silicon oxide film at substantially the same etching rate is a cleaning step.

3. A silicon substrate surface processing method comprising the steps of:

setting a silicon substrate into a processing bath;

supplying at least an HF water solution and ozone water into the processing bath to create a mixture containing HF with a concentration of 0.01% to 1% and ozone water with a concentration of 0.1 ppm to 20 ppm and kept at a temperature of 10° to 30° C. and processing the surface of the silicons substrate by use of the mixture;

supplying ozone water into the processing bath to replace the mixture by the ozone water;

supplying pure water into the processing bath to replace the ozone water by the pure water; and taking out the silicon substrate from the processing bath and drying the same.

4. A surface processing method according to claim 3, wherein said step of processing the surface of the silicon substrate by use of the mixture is a step of cleaning the surface of the silicon substrate.

5. A surface processing method according to claim 3, wherein the silicon substrate has a silicon oxide film formed on part of the surface thereof, and said step of processing the surface of the silicon substrate by use of the mixture is a step of simultaneously cleaning the surface of the silicon substrate and the surface of the silicon oxide film.

6. A surface processing method according to claim 3, wherein said step of supplying ozone water into the processing bath to replace the mixture by the ozone water is effected while ultrasonic vibration is applied thereto.

7. A surface processing method according to claim 3, wherein said step of supplying pure water into the processing bath to replace the ozone water by the pure water is effected while ultrasonic vibration is applied thereto.

8. A method for treating the surface of a silicon substrate, comprising:

the step of mixing HF water solution with ozone water thereby to create a mixture with an HF concentration of 0.01% to 1%, an ozone water concentration of 0.1 ppm to 20 ppm, and a temperature of 10° to 30° C.; and the step of applying the mixture from a nozzle to the surface of a silicon substrate on which a silicon oxide film is partially formed, thereby to etch the silicon substrate and the silicon oxide film formed thereon at substantially the same etching rate.

9. The method according to claim 8, wherein the step of etching the silicon substrate and the silicon oxide film at substantially the same etching rate is a cleaning step.

10. The method according to claim 8, wherein the step of etching the silicon substrate and the silicon oxide film formed thereon at substantially the same etching rate is performed, while the silicon substrate is placed on a rotary table and rotated together with the rotary table, and the nozzle is moved in a radial direction of the silicon substrate.

* * * * *